United States Patent [19]

Böer

[11] Patent Number: 5,340,408
[45] Date of Patent: Aug. 23, 1994

[54] INVERSE DELTA-DOPING FOR IMPROVED OPEN CIRCUIT VOLTAGE OF SOLAR CELLS OR PHOTO DIODES

[75] Inventor: Karl W. Böer, Kennett Square, Pa.

[73] Assignee: The University of Delaware, Newark, Del.

[21] Appl. No.: 49,101

[22] Filed: Apr. 19, 1993

[51] Int. Cl.$^5$ ............................................. H01L 31/06
[52] U.S. Cl. ................................... 136/255; 136/261; 136/262; 257/184; 257/431; 257/463; 257/464
[58] Field of Search .................. 136/255, 261, 262; 257/184, 189, 431, 458, 461, 463–464, 656

[56] References Cited

U.S. PATENT DOCUMENTS

4,524,237  6/1985  Ross et al. ........................... 136/261
4,681,983  7/1987  Markvart et al. .................... 136/255

*Primary Examiner*—Aaron Weisstuch
*Attorney, Agent, or Firm*—Connolly & Hutz

[57] ABSTRACT

A solar cell or photo diode has an n-type semiconductor layer and a p-type semiconductor layer which form a pn-junction at the metallurgical interface of the layers. A thin sheet of undoped semiconductor is located at the interface or the lower doped layer. The sheet has less recombination centers than its adjacent regions and prevents cross-doping of donors and acceptors from the n- and p-side by cross-diffusion to increase the open circuit voltage and fill-factor of the solar cells or photo diode.

18 Claims, 7 Drawing Sheets

_Fig.3._

_Fig.4._

INVERSE DELTA-DOPING FOR IMPROVED OPEN CIRCUIT VOLTAGE OF SOLAR CELLS OR PHOTO DIODES

BACKGROUND OF THE INVENTION

High-efficiency solar cells or photo diodes are known to approach theoretical limits in collection efficiency, relating to the short circuit current. However, the actual conversion efficiency is derived by a product of short circuit current, fill factor, and open circuit voltage. It is the open circuit voltage, and to some extent the fill factor, that is known to stubbornly resist all attempts for further improvement to also approximate theoretical limits. It has long been known that recombination is a major factor that limits the actually achievable conversion efficiency. However, practical reasons prevent avoidance of recombination centers in the entire solar cell. Moreover, cross-diffusion of donors and acceptors produces automatically pairs of these that are suspected of being efficient recombination centers.

It would be desirable if some techniques could be developed for increasing the open-circuit voltage of solar cells or photo diodes to levels approaching the maximum attainable collection efficiency for the short circuit current.

SUMMARY OF THE INVENTION

An object of this invention is to provide techniques for increasing the open-circuit voltage ($V_{oc}$) and fill factor (FF) of solar cells or photo diodes to meet the above needs.

A further object of this invention is to utilize inverse delta-doping as a means of improving the conversion efficiency which is derived by a product of short circuit current, fill factor, and open circuit voltage.

A still further object of this invention is to provide such techniques which lend themselves to commercial practices.

In accordance with this invention a thin sheet devoid of recombination centers (and within or adjacent, but in proximity to this sheet is a thinner layer of undoped semiconductor) is located within the lesser doped of the p-type and n-type semiconductor layers close to the interface, but separate from it if $N_D$ does not equal $N_A$. [As used herein $N_D$ is the donor density, $N_A$ is the acceptor density.] The sheet has less recombination centers than its adjacent regions. Within this sheet, or adjacent to it is a much thinner layer that is undoped and thereby prevents cross-doping of donors and acceptors from the n- and p-side by cross-diffusion; this prevents formation of close donor/acceptor pairs and thereby results in an increase of the open circuit voltage and fill-factor.

The sheet devoid of recombination centers is preferably 5–50 nm thick and is located where the electron and hole densities are about equal at $V_{oc}$. The layer devoid of dopants is preferably only a few atomic layers in thickness and is located at a position within or between the sheet and the metallurgical interface. Both the sheet and the layer may advantageously be applied by molecular beam epitaxy (MBE) onto a single crystal wafer. The adjacent layers to the sheet and the layer devoid of dopants may be of the same doping density as the crystal wafer and then followed by a heavily doped layer that is also applied by molecular beam epitaxy.

The sheet which may be considered a thin inverse delta-doped layer with increased carrier lifetime is preferably introduced into one of the layers such as the lower doped, preferably the p-layer of an asymmetrically doped solar cell or photo diode. The invention may be used with homojunction or heterojunction devices.

DETAILED DESCRIPTION

The present invention is based upon the recognition by the inventor that recombination centers are much more efficient at or near the pn-junction interface than in the bulk of the solar cell for reducing the open circuit voltage. As a result, the invention utilizes a thin sheet which does not contain recombination centers to raise the open circuit voltage. In general, this sheet which may be considered an inverse delta-doped sheet would be of the order of 5–100 and preferably 5–50 nm thick and would contain less recombination centers than the adjacent regions. This sheet may contain another layer that is undoped and quite thin, being only a few atomic layers in thickness and would prevent cross-doping of donors and acceptors from the n- and p-side by cross-diffusion. The actual position of this undoped layer depends on the $N_D/N_A$ ratio and may be shifted from its center position (i.e. centered within the inverse delta-doped sheet) toward the doping interface, even outside of the inverse delta doped sheet close to the metallurgical pn interface. By means of this layer the recombination traffic in the solar cell is substantially reduced at a place where electron and hole densities are about equal and recombination therefore is most detrimental to the development of a large open circuit voltage and a high fill factor.

The insertion of such a layer of high purity and crystal perfection can be accomplished by atomic layer deposition, e.g. by molecular beam epitaxy (MBE) onto a single crystal wafer.

The top layer of a photo diode or solar cell is usually heavily doped. This adjacent layer should also be deposited by MBE or a similar method that does not stimulate excessive diffusion into the previously deposited high purity sheet and into the undoped layer. The completion of the cell with electrodes and anti-reflection coating can proceed by conventional means as later described.

Advantageously, the above techniques for inserting the composite devoid of recombination centers and containing a sheet that is inverse delta-doped layer and a thinner layer of undoped semiconductor can be utilized in a homojunction that consists of the same basic semiconductor material or near the interface of a heterojunction that consists of a wider band gap semiconductor material adjacent to a narrower band gap semiconductor inverse delta-doped sheet assisted by the thin undoped layer.

The insertion of the thin interlayer proposed by the invention results in an improvement that is a factor of twenty times larger than the proportional improvement by reduction of recombination centers in the entire material which substantiates the invention regarding providing such a composite interlayer at or near the junction interface. These results represent a breakthrough in the decade long yet unsuccessful struggle to substantially improve the open circuit voltage and fill factor.

As noted, junction recombination causes degradation of the solar cell or photo diode performance. Such recombination is the major contributor to a reduction of the open circuit voltage and fill factor long before it is strong enough to also reduce the saturation (i.e. short circuit) current.

Earlier investigation of a delta-doped layer with additional deep-level centers show a strong dependency of the degree of reduction of $V_{oc}$ on the position of its incorporation with respect to the metallurgical interface of a symmetrically doped pn-junction. It causes a significant degradation of $V_{oc}$ only when it is close to the interface—see FIG. 1. The reported numerical results are obtained by integrating transport, continuity, and Poisson-equations for a two-carrier model using a modified PC-1D software and used parameters for a typical GaAs homojunction photo diode, as listed in P. Basore, *IEEE Trans. El. Dev.,* 37(2), 337(1990) and Piprek et al., *phys. stat. sol.(b)* 173,661(1992).

Figure 1:
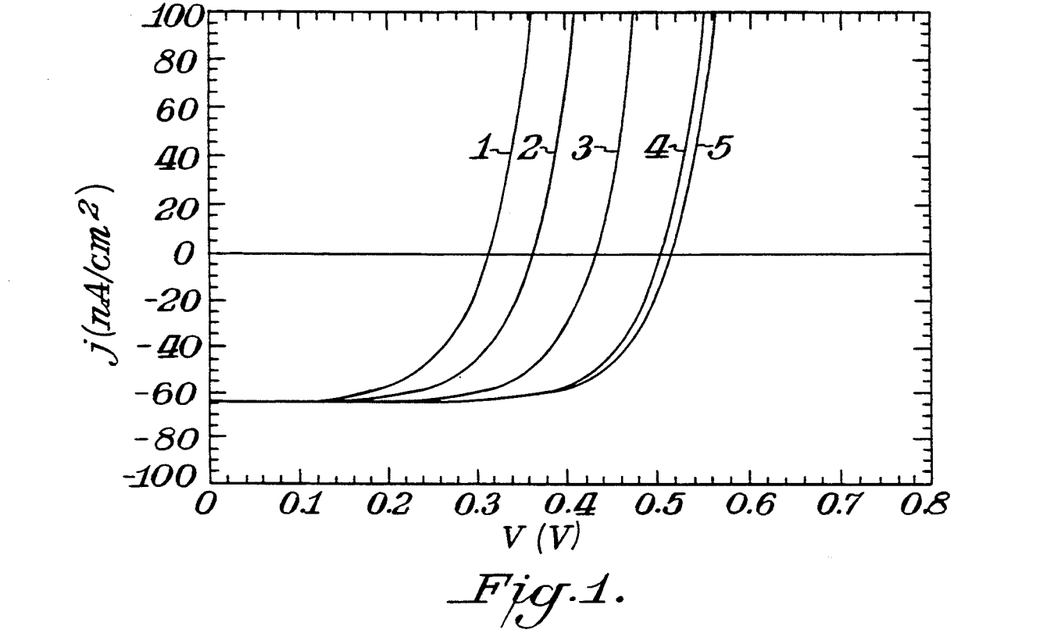
FIGS. 1–2 are graphs illustrating the voltage and current density characteristics of photo diodes.

FIG. 1 describes the $V_{oc}$ degradation when a thin delta-doped layer with reduced carrier lifetime (i.e. with additional deep level centers) is introduced and illustrates the undesirability of introducing recombination centers at the place where n=p. This is usually done unintentionally by bringing donors and acceptors close to each other near the pn-interface hence producing donor-acceptor pairs that are known to act as efficient recombination centers. Hence curves three or four of FIG. 1 are apparently close to the reality for a symmetrically doped pn-device (however, the actual device is asymmetrically doped; hence the most effective position of the delta doped layer is shifted to lie within the lower doped region).

In FIG. 1 there is shown a family of jV-characteristics of thin symmetrically doped GaAs photo diodes with homogeneous optical generation rates of $g_o = 10^{16}$ $cm^{-3}s^{-1}$ with delta-doped deep levels with a recombination level at $E_r = E_i - 0.2$ eV within a layer of 5 nm thickness, resulting in a minority carrier lifetime within this layer of $\tau = 10^{-9}$ s. The delta-doped sheet is placed at the p-side with the distance from the metallurgical interface of 0, 5, 10, and 20 nm for curves 1–4 respectively. Curve 5 is computed for a non delta-doped layer. The carrier lifetime in both sides of the device is assumed as $10^{-7}$ s. $E_i$=intrinsic level that lies near the center of the band gap. From this figure it is obvious that the higher degradation of $V_{oc}$ is observed when this layer is incorporated where n=p, and has little effect when it is present more than 20 nm away from this position.

In the analysis reported here, the model given in Piprek et al. Proc. SPIE, 1679 *Physics and Simulation of Optoelectronic Devices,* 232 (1992) is extended by introducing a sheet with different doping of shallow and deep-level centers, and of variable width and position with respect to the original metallurgical interface of the pn-junction. Since the doping boundaries of this sheet are abrupt, and its width is typically only a few nm, it is referred to it as a delta-doped sheet.

Figure 2:
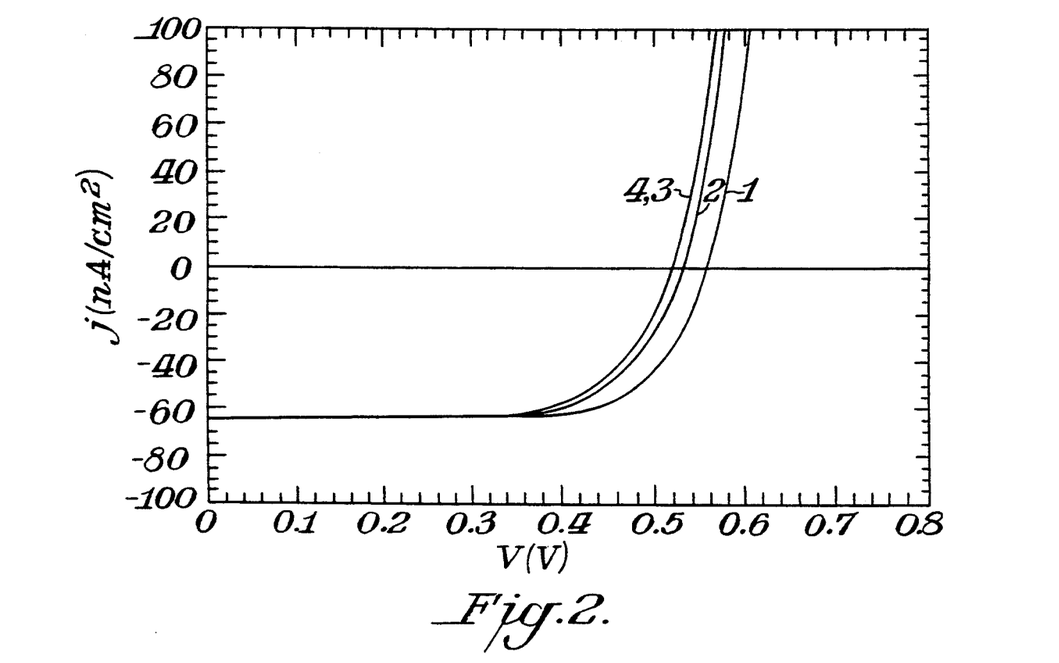

With the reported shift of $V_{oc}$ due to an inserted layer with increased recombination as shown in FIG. 1, it is suggestive to reduce, or to omit deep levels within a thin sheet ("inverse delta-doping") i.e. to reduce recombinations and deploy such a sheet close to the junction interface. FIG. 2 shows the results, compared again for a symmetrically doped device, however, containing a thin layer with a factor of 100 reduced density of recombination centers. It results in a marked increase of the open circuit voltage when the sheet approaches the interface.

FIG. 2 shows jV-characteristics as in FIG. 1; however, with an inverse delta-doped layer of 5 nm thickness and of a substantially reduced density of deep-level centers, resulting in a monitory carrier lifetime of $\tau = 10^{-5}$ s which is now increased above the bulk minority carrier lifetime of $10^{-7}$ by a factor of 100. The shift of the center-plane of this sheet from the metallurgical boundary of the pn-junction is 10, 5, and 0 nm for curves 3-1, respectively. Curve 4 is computed without an interlayer. FIG. 2 thus shows the opposite effect of FIG. 1. In FIG. 2 an inverse delta-doped layer which is deprived of recombination centers is introduced, thus there is an increase of $V_{oc}$, the more so the closer this layer is to the actual pn-interface in this symmetrical pn-junction, i.e. exactly at the position where n=p.

Figure 3:
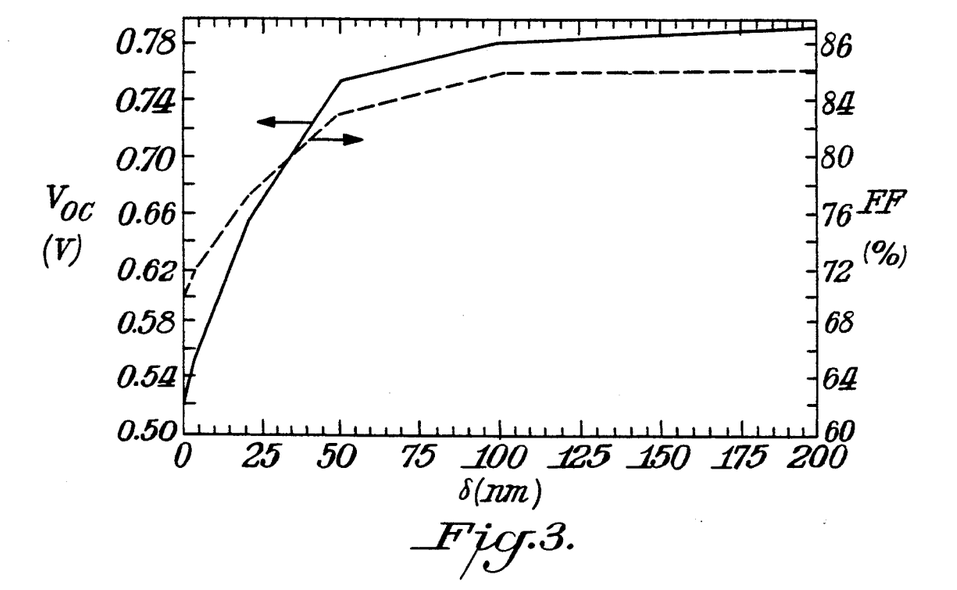
FIG. 3 is a graph comparing the open circuit voltage and fill factor with the width of the delta sheet.

FIG. 3 shows the improvement of $V_{oc}$ and the fill-factor (FF) as a function of the inverse delta-doped layer thickness $\delta$ for the symmetrical pn-junction diode as given in FIG. 2. The inserted layer remains centered at the metallurgical boundary and has a minority carrier lifetime of $\tau = 10^{-5}$s that is a factor 100 larger than that in the bulk.

In asymmetrically doped pn-junctions the inverse delta-doped layer must be located precisely at the position of the cross-over of n(x) and p(x) when $V = V_{oc}$. This cross-over is shifted from the metallurgical interface into the lower doped region by a distance on the order of the Debye length. (See Böer, Survey of Semiconductor Physics (Van Nostrand Reinhold, New York, 1992)).

Figure 4:
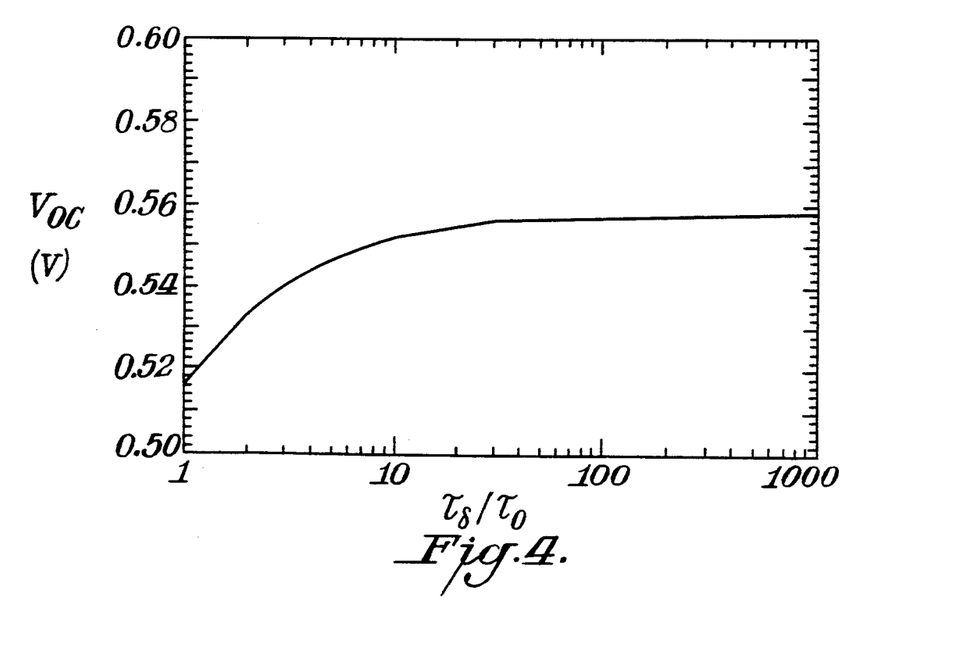
FIG. 4 is a graph illustrating the open circuit improvement as a function of the ratio of lifetimes within the inverse delta-doped sheet.

For the full benefit of the $V_{oc}$-improvement, it suffices to have the recombination center density reduced by two orders of magnitude, with most of the shift already achieved when $N_r$ is reduced by a factor of 10 (See FIG. 4). FIG. 4 shows that only a relatively modest increase in carrier lifetime in this inverse delta-doped layer is sufficient for a marked $V_{oc}$ improvement, and, for further increased lifetimes the improvement saturates. FIG. 4 illustrates $V_{oc}$-improvement as a function of the ratio of lifetimes within the inverse-delta-doped layer to that of the remainder of the symmetrical device of FIG. 2. Here a layer width of 5 nm for the inverse delta doped layer is assumed.

For actual GaAs devices the experimental short circuit current can be brought close to the theoretical maximum value, while it is much more difficult to bring the open circuit voltage and the fill factor close to the theoretical limits. This seems to indicate that sufficient recombination centers always remain close to the crossover point of n(x) and p(x). Donor-acceptor pairs could act as such recombination centers at or near the junction interface even in the ultra-clean (except for shallow donors or acceptors) semiconductors. Such pairs are plentiful at and near the metallurgical interface.

Figure 5:
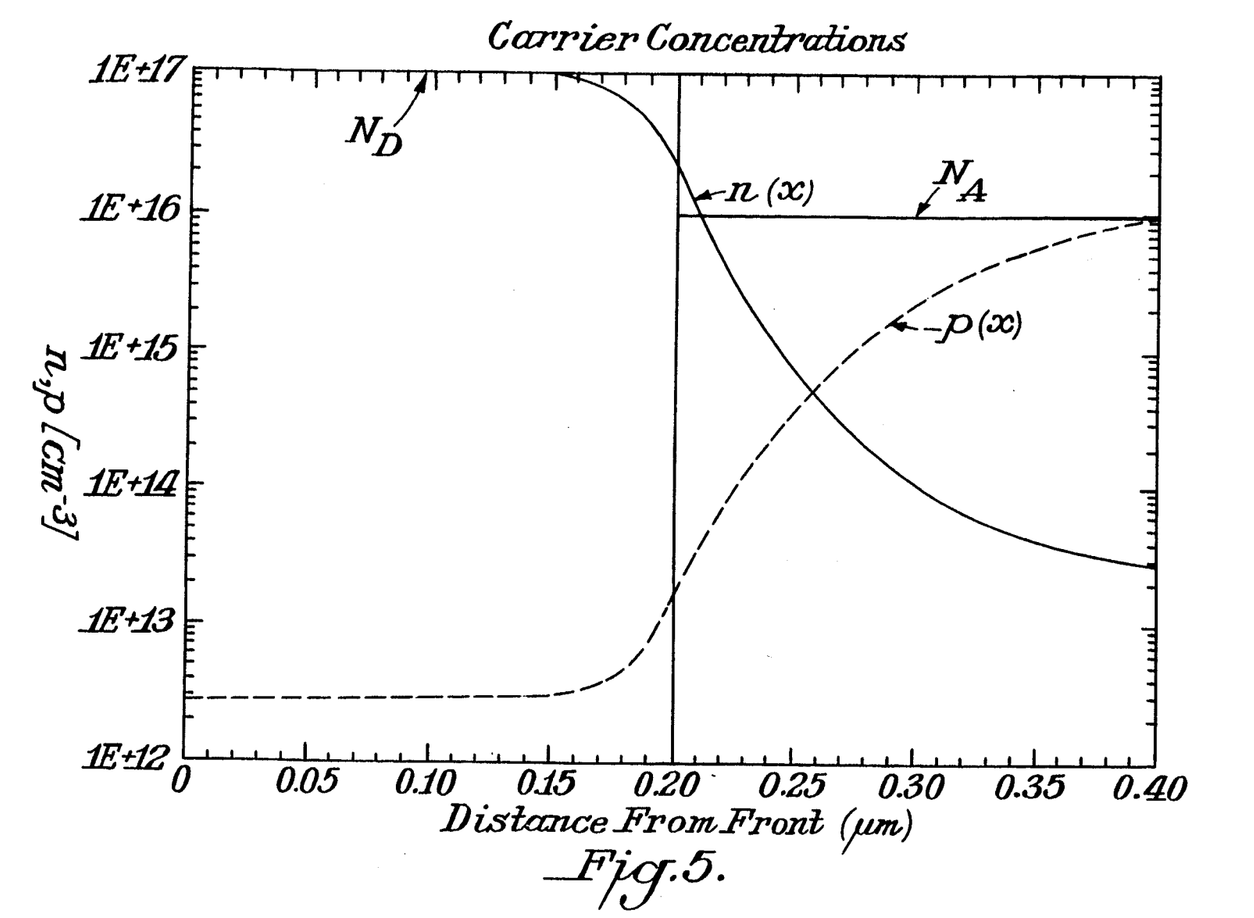
FIG. 5 is a graph illustrating the doping and carrier concentrations of an asymmetrically doped device.
Figure 6:
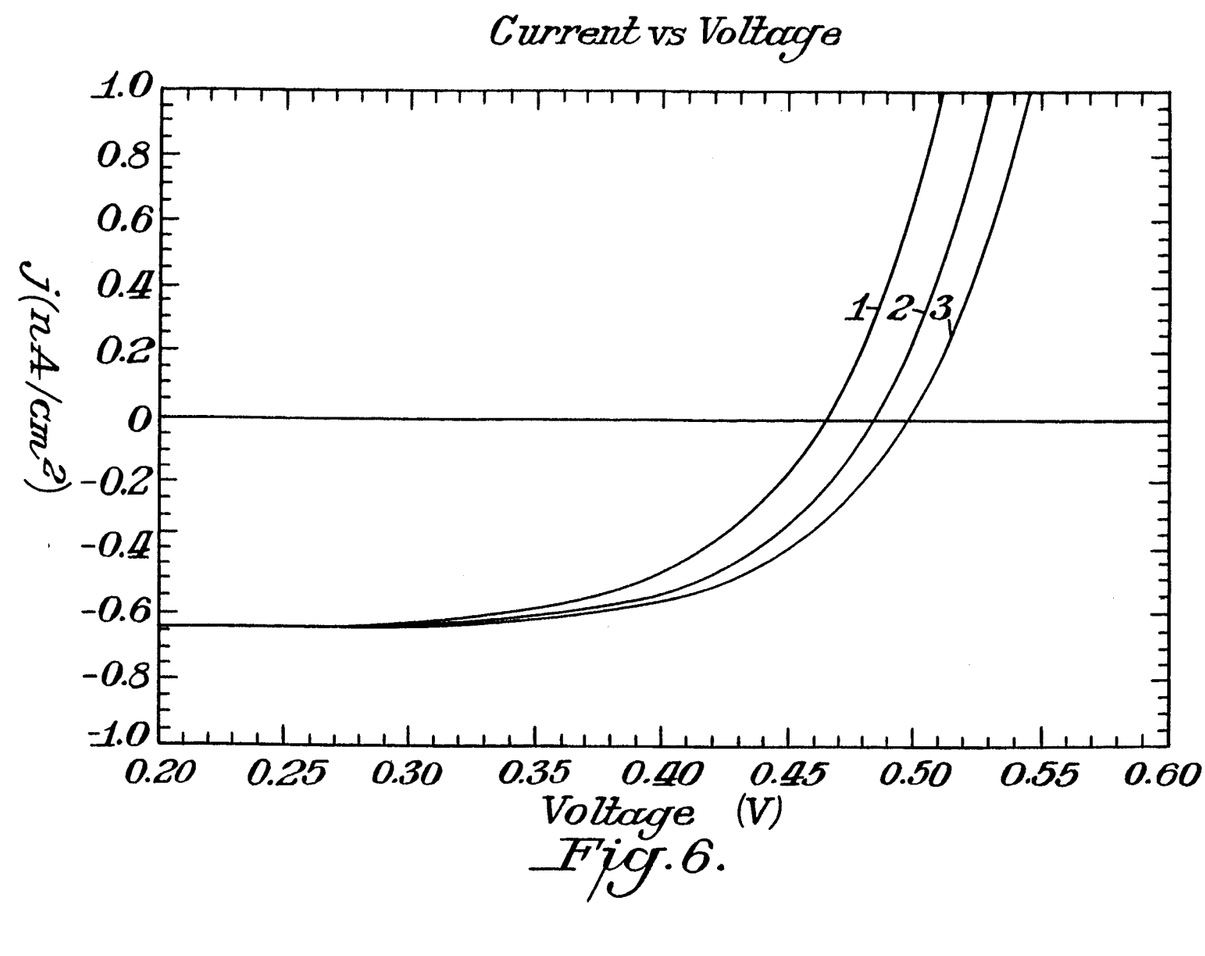
FIG. 6 is a graph illustrating the current versus voltage relationship regarding the placement of the inverse delta-doped sheet.

In an asymmetrically doped device, i.e., in a device that, e.g., has a much higher density of donors in the n-type region than acceptors in the p-type region, the sheet where n=p is shifted from the pn-interface into the lower doped region by a substantial distance (55 nm in the example shown at FIG. 5). The inverse delta-doped sheet must be centered at this position to have maximum effect. In fact, it has no effect whatsoever if placed at the pn interface identified by a vertical line in FIG. 5. This is shown in FIG. 6 where for the same asymmetrical pn-junction the jV-characteristics are plotted that show the uninfluenced characteristic at curve 1 for no layer, and one at 0 and at 30 nm for the interface. These three curves are undistinguishable. Curve 2 is taken for an inverse delta-doped sheet at 40 and 75 nm from the interface and shows that some interlayer at 40 and at 75 nm from the interface gives some improvement. The maximum improvement is shown in curve 3 and is obtained when the interlayer is centered exactly at n=p, i.e. at 55 nm from the interface.

Figure 8A:
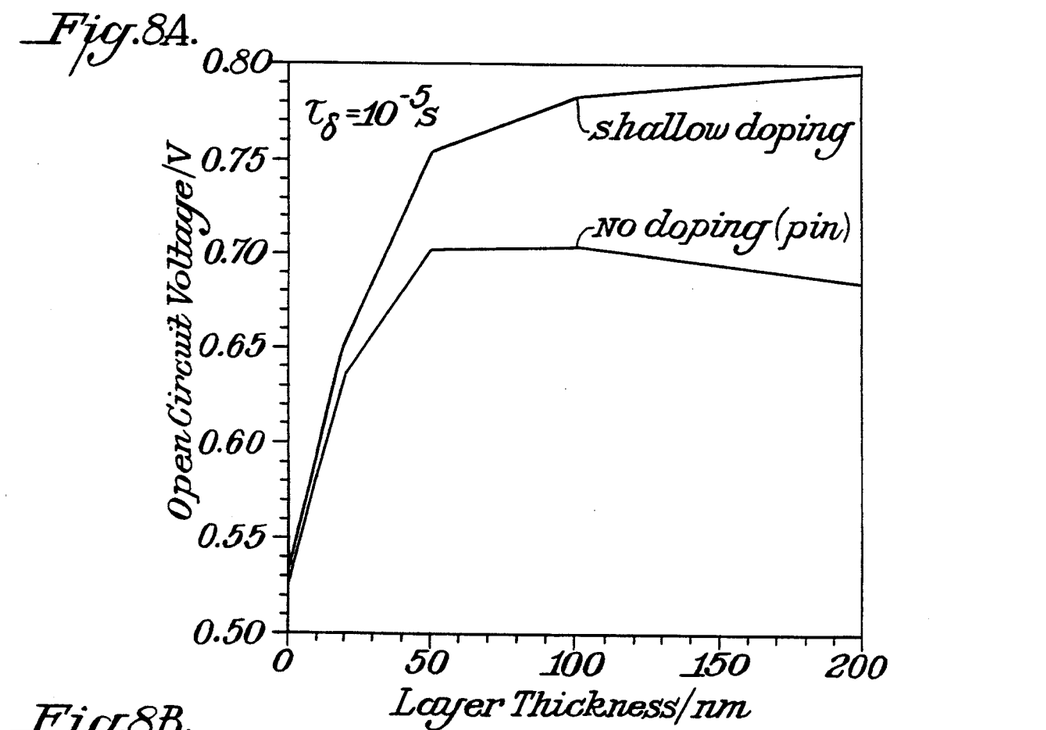
FIG. 8A is a graph comparing the layer thickness with the open circuit voltage for no doping and for shallow doping.

It should, however, be recognized that the inverse delta-doped sheet is distinctly different from an i-layer that is conventionally undoped, i.e. devoid of donors and acceptors, or compensated by the same density of donors and acceptors. Though incorporation of such an i-layer also improves the $V_{oc}$, as shown in FIG. 8A, its improving power stays well below that of an inserted inverse delta-doped sheet that is only devoid of recombination centers but continues to have the same donor or acceptor density (shallow doping) as the adjacent semiconductor. See, FIG. 8A for the curve labeled shallow doping. The invention therefore proposes to insert an inverse delta-doped sheet as described above of a thickness of about 5–100 nm. However, since a significant fraction, if not most of the recombination centers in actual solar cells are believed to be produced by donor-acceptor pairs, the invention also proposes to reduce their concentration or to completely avoid close donor-acceptor pairs by producing the pn-junction via MBE rather than by diffusion from the top of the cell that inadvertently produces a large density of such pairs. In addition, the invention utilizes a much thinner (than the thickness of the delta-doped sheet) i-layer that physically separates donors and acceptors. That layer would therefore be placed at or close to the metallurgical interface of the n and p parts of the device and would typically be 2–20 atomic layers thick to avoid close donor-acceptor pair formations. Since recombination centers degrade at a position where n=p and since such compensation may occur over a wider region, such i-layer may be incorporated at the center of the inverse delta-doped layer or at a position between this center portion and a position close to the metallurgical interface of the pn-junction so as to optimize the $V_{oc}$ and the FF of the device.

Figure 8B:
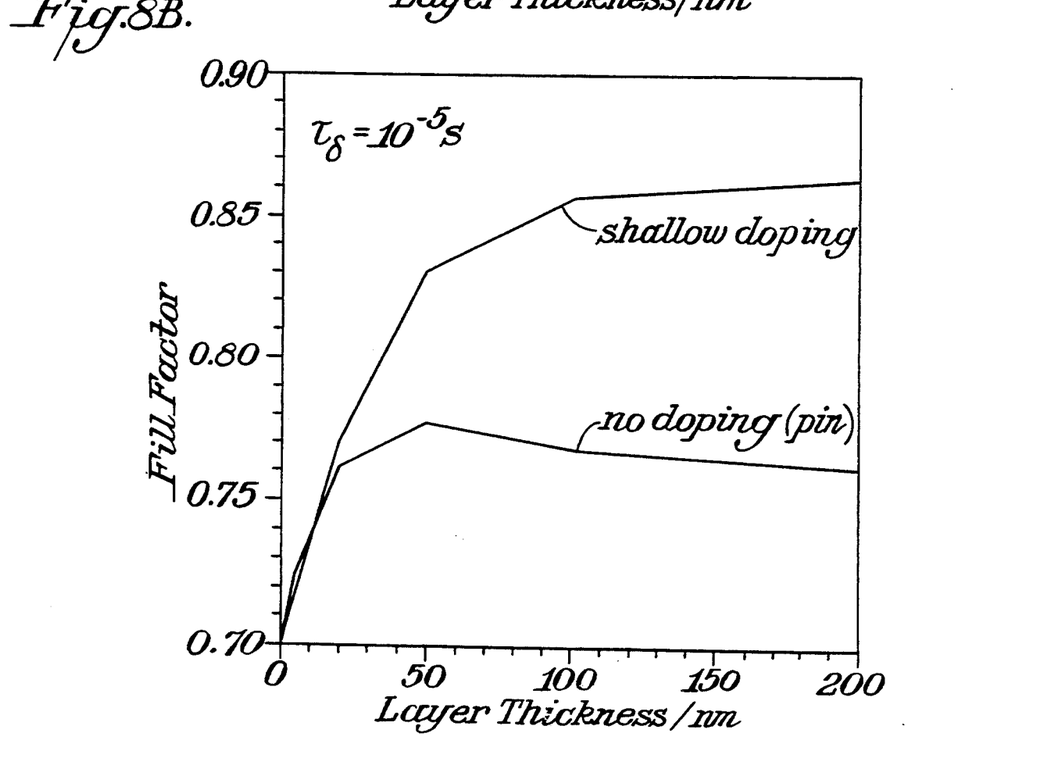
FIG. 8B is a graph comparing the layer thickness with fill factor for no doping and for shallow doping.

FIG. 8B shows a similar comparison as FIG. 8A but with respect to the fill factor instead of the open circuit voltage.

Figure 9A:
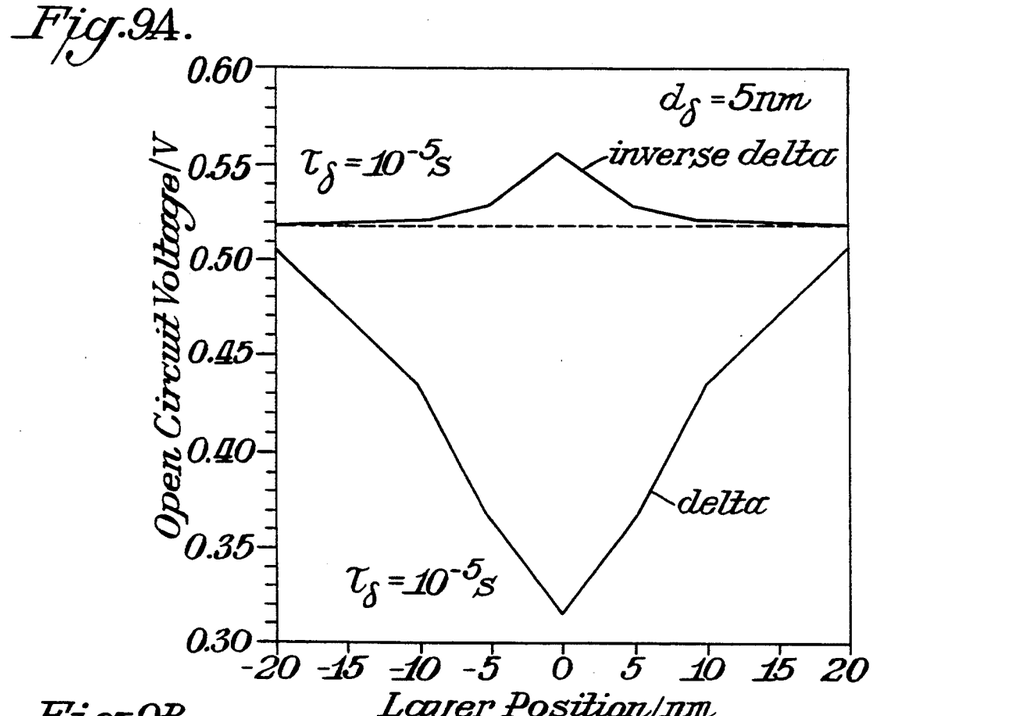
FIG. 9A is a graph for a symmetrical junction device comparing the sheet thickness with the open circuit voltage for a delta sheet and for an inverse delta-doped sheet.
Figure 9B:
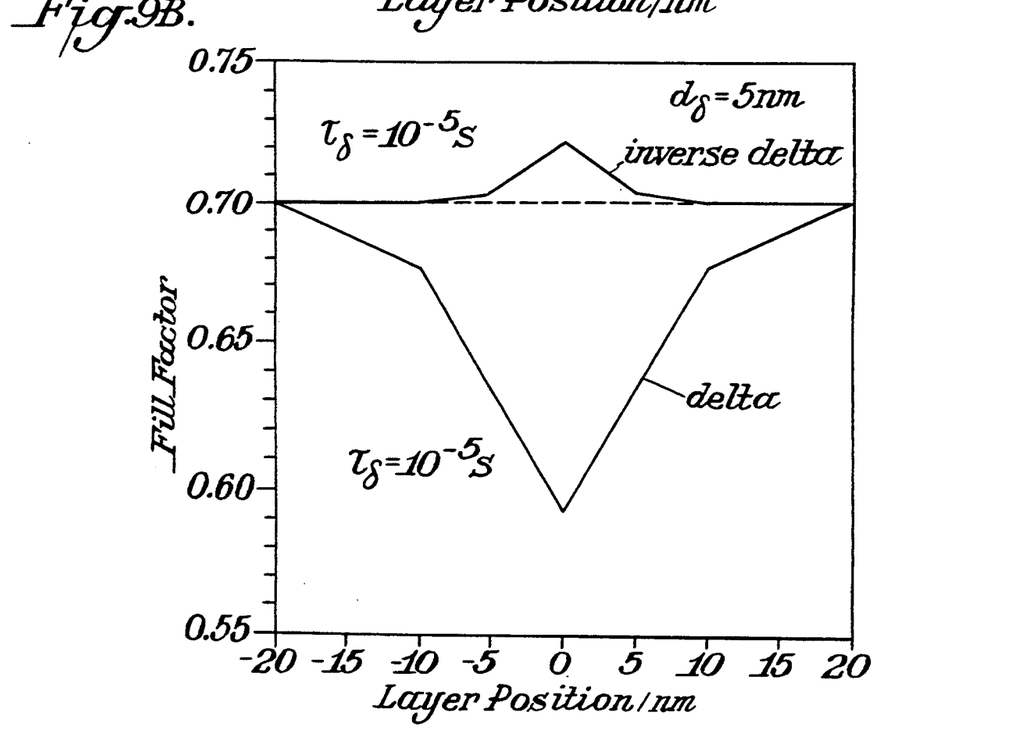
FIG. 9B is a graph similar to FIG. 9A but comparing the layer thickness with fill factor.

FIGS. 9A and 9B also show the importance in the use of an inverse delta-doped sheet as compared with a delta-doped sheet. As shown therein, when a delta-doped sheet is used there is a reduction in open circuit voltage and in fill factor in accordance with the sheet position. Where an inverse delta-doped sheet is used there is an improvement, however, only when close to the position where n=p, i.e. here for a symmetrically doped pn-junction at the metallurgical boundary (at x=0).

Figure 7A:
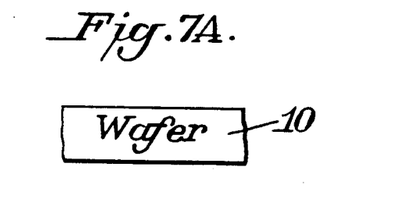
FIGS. 7A–7F schematically shows the sequence in steps used in the forming of a solar cell in accordance with this invention.
Figure 7B:
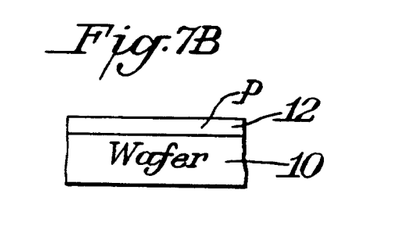
Figure 7C:
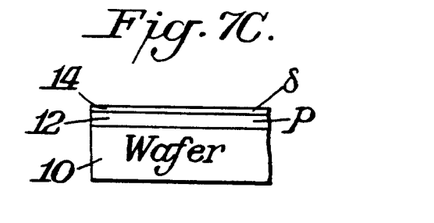
Figure 7D:
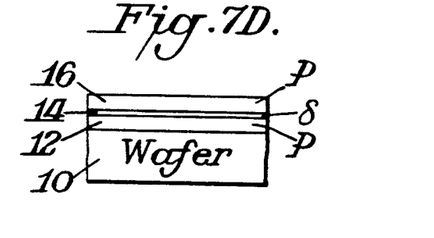

FIGS. 7A–7F show the sequence of MBE deposition in the forming of a solar cell in accordance with this invention. As shown in FIG. 7A a wafer 10 forms the base or substrate for the solar cell. Wafer 10 may be made of any suitable known material such as GaAs or Si. It could be n- or p-type. However, it is preferably p-type. For definiteness of this example we assume that wafer 10 is p-type. FIG. 7B illustrates a p-type layer 12 with the same density of acceptors is grown by MBE on wafer 10. As shown in FIG. 7C an inverse delta-doped sheet 14 is then grown by MBE on p layer 12. Sheet 14 is later described in greater detail with respect to FIG. 7G. FIG. 7D illustrates a further portion of p-type layer 16 with the same density of acceptors as layers 10 and 12 is grown on top of the inverse delta-doped sheet 14.

Figure 7E:
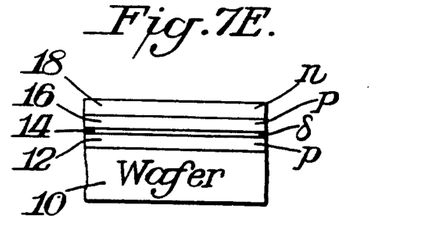

FIG. 7E shows the next sequence in deposition wherein a more heavily doped n-type layer 18 is grown by, for example, MBE on p-layer 16.

Figure 7F:
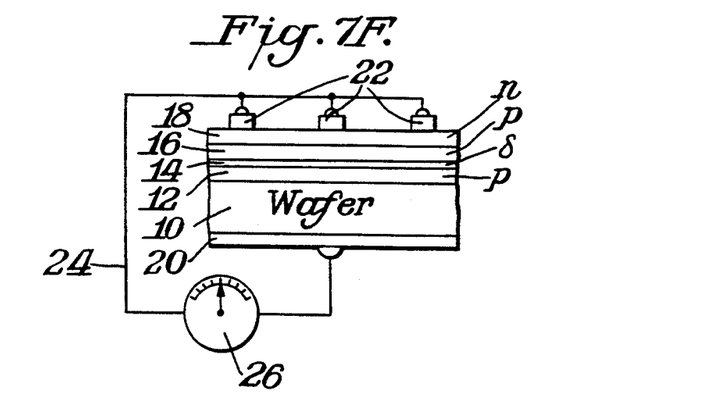

After the various layers have been grown the remainder of the solar cell is completed by forming a base electrode 20 below wafer 10 and forming, for example, an electrode grid on the more heavily doped n-layer 18. The electrodes 22 and 20 are suitably interconnected by circuitry 24 with a meter 26 being installed in the circuit in a known manner. If desired, the electrode grid 22 could be covered by an anti-reflecting coating in the manner known in the art to form the finished solar cell.

Figure 7G:
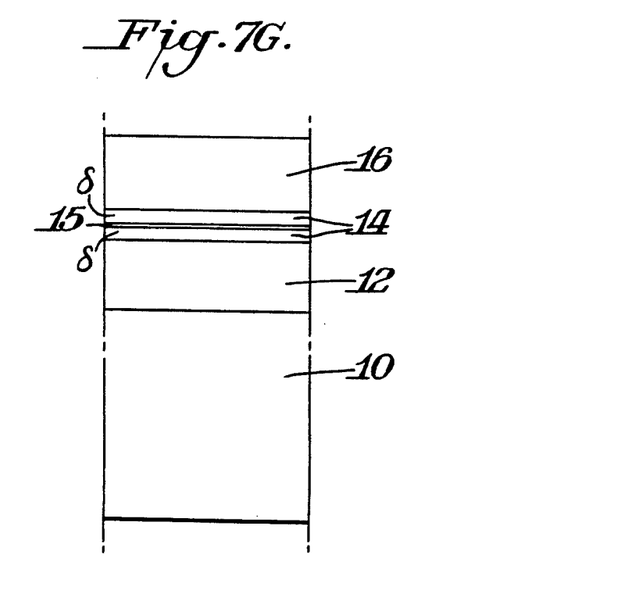
FIG. 7G shows a preferred form of inverse delta doped sheet.

In order to reduce the recombination center density in the inverse delta-doped sheet 14 one continues p-doping as in layer 12 but interrupts this doping in the center plane of layer 14 for few atomic layers. (Typically the thickness is 2–20 atomic layers, preferably 5 atomic layers.) The doping then continues with p-doping until layer 14 is completed. FIG. 7G illustrates this i-layer 15 formed in the center of layer 14.

Alternatively, this undoped interlayer is inserted on top of layer 14 just before layer 16 is formed.

In a further alternative the undoped layer 15 is inserted between the p-type layer 16 and the heavily doped n-layer 18.

The actual positioning of the undoped interlayer 15 depends on the diffusivity of donors at the maximum preparation temperature of the device and the ratio of $N_D/N_A$. The purpose of this i-layer is to reduce the density of close donor-acceptor pairs near to the position where n=p. Such undoped layer is often referred to as an i-layer. It is, however, imperative to keep the i-layer thickness at a minimum, preferably below 5 nm as the device performance degrades with increasing i-layer thickness.

What is claimed is:

1. In a solar cell or photo diode device having an n-type semiconductor layer and a p-type semiconductor layer forming a pn-junction at the metallurgical interface of said layers, the improvement being in that a thin sheet with reduced density of recombination centers is inserted into a lesser doped region of said layers, said thin sheet being an inverse delta-doped sheet, said sheet having less recombination centers than its adjacent regions, to increase the open circuit voltage and fill-factor of said device.

2. The device of claim 1 wherein said sheet of reduced density of recombination centers is of about 5-100 nm thickness.

3. The device of claim 2 wherein said inverse delta doped sheet is located where the electron and hole density are about equal to each other.

4. The device of claim 3 wherein said sheet is applied by molecular beam epitaxy onto a single crystal.

5. The device of claim 1 wherein one of said semiconductor layers is a top semiconductor layer which is heavily doped and applied by molecular beam epitaxy.

6. The device of claim 1 wherein said junction is a homojunction.

7. The device of claim 1 wherein said junction is a heterojunction, and said sheet is applied at or near the interface of said heterojunction.

8. The device of claim 1 wherein said sheet is located where the electron and hole density are about equal.

9. The device of claim 1 wherein within or close to said sheet of reduced recombination centers there is inserted a thin layer devoid of shallow dopants to prevent cross-doping of donors and acceptors and thereby avoid formation of close donor-acceptor pairs.

10. The device of claim 9 wherein said layer devoid of shallow dopants is located at a position close to $n=p$ where it is able to reduce most effectively the recombinations caused by close donor-acceptor pairs near $n=p$.

11. The device of claim 9 wherein said thin layer is an i-layer of 2-20 atomic layers thick.

12. The device of claim 9 wherein said layer devoid of shallow dopants is within said inverse delta-doped sheet.

13. The device of claim 9 wherein said layer devoid of shallow dopants is in a layer between said inverse delta-doped sheet and a heavily doped layer.

14. The device of claim 9 wherein said layer devoid of shallow dopants is applied at the metallurgical boundary separating the n- and p-doping.

15. In a method of improving the open circuit voltage of a solar cell or photo diode device, wherein the device has an n-type semiconductor and a p-type semiconductor layer forming a pn-junction at the metallurgical interface of the layers, the improvement being in inserting within one of the layers a thin layer of an undoped semiconductor preventing formation of close donor-acceptor pairs, and inserting a thin sheet within one of the layers, with the sheet having less recombination centers than its adjacent regions.

16. The method of claim 15 wherein said sheet is an inverse delta-doped sheet of 5-100 nm thickness and the undoped layer is of about a few atomic layers thickness.

17. The method of claim 16 including locating the inverse delta-doped sheet where the electron and hole densities are about equal.

18. The method of claim 17 wherein the device is made by growing of the semiconductors layers on top of a wafer, and forming the undoped layer and the sheet by molecular beam epitaxy.

* * * * *